United States Patent
Kawamura et al.

[11] Patent Number: 5,773,844
[45] Date of Patent: Jun. 30, 1998

[54] METHOD OF FORMING A POLYCRYSTALLINE SILICON LAYER, A THIN FILM TRANSISTOR HAVING THE POLYCRYSTALLINE SILICON LAYER, METHOD OF MANUFACTURING THE SAME, AND A LIQUID CRYSTAL DISPLAY DEVICE HAVING THE THIN FILM TRANSISTOR

[75] Inventors: Shinichi Kawamura; Kaichi Fukuda, both of Yokohama; Takeshi Kashiro, Kawasaki; Shigetaka Toriyama, Yokohama, all of Japan

[73] Assignee: Kabushiki Kaisha Toshiba, Kawasaki, Japan

[21] Appl. No.: 691,609

[22] Filed: Aug. 2, 1996

[30] Foreign Application Priority Data

Sep. 25, 1995 [JP] Japan .................................. 7-246500
Sep. 26, 1995 [JP] Japan .................................. 7-248094

[51] Int. Cl.[6] .............................................. H01L 29/04
[52] U.S. Cl. .............................. 257/57; 257/72; 257/411
[58] Field of Search .................................. 257/57, 59, 61, 257/66, 72, 411

[56] References Cited

U.S. PATENT DOCUMENTS 5,500,380 3/1996 Kim .......................................... 257/411
5,614,729 3/1997 Ukai et al. .................................. 257/57

FOREIGN PATENT DOCUMENTS 6-93515 11/1994 Japan .

*Primary Examiner*—Mark V. Prenty
*Attorney, Agent, or Firm*—Cushman Darby & Cushman IP Group of Pillsbury Madison & Sutro, LLP

[57] ABSTRACT

A thin film transistor includes an amorphous silicon layer formed on a substrate, a gate insulator formed on the amorphous silicon layer, a gate electrode formed on the gate insulator, source and drain contact regions of polycrystalline silicon formed in the amorphous silicon layer on both sides of the gate electrode, and source and drain electrodes formed respectively in contact with the source and drain contact regions. Particularly, the gate insulator includes a first insulating film which covers the amorphous silicon layer as a reflectivity reducing film for reducing the optical reflectivity of the amorphous silicon layer and the source and drain contact regions are formed by an annealing process for applying a laser beam to the amorphous silicon layer via the first insulating film.

7 Claims, 5 Drawing Sheets

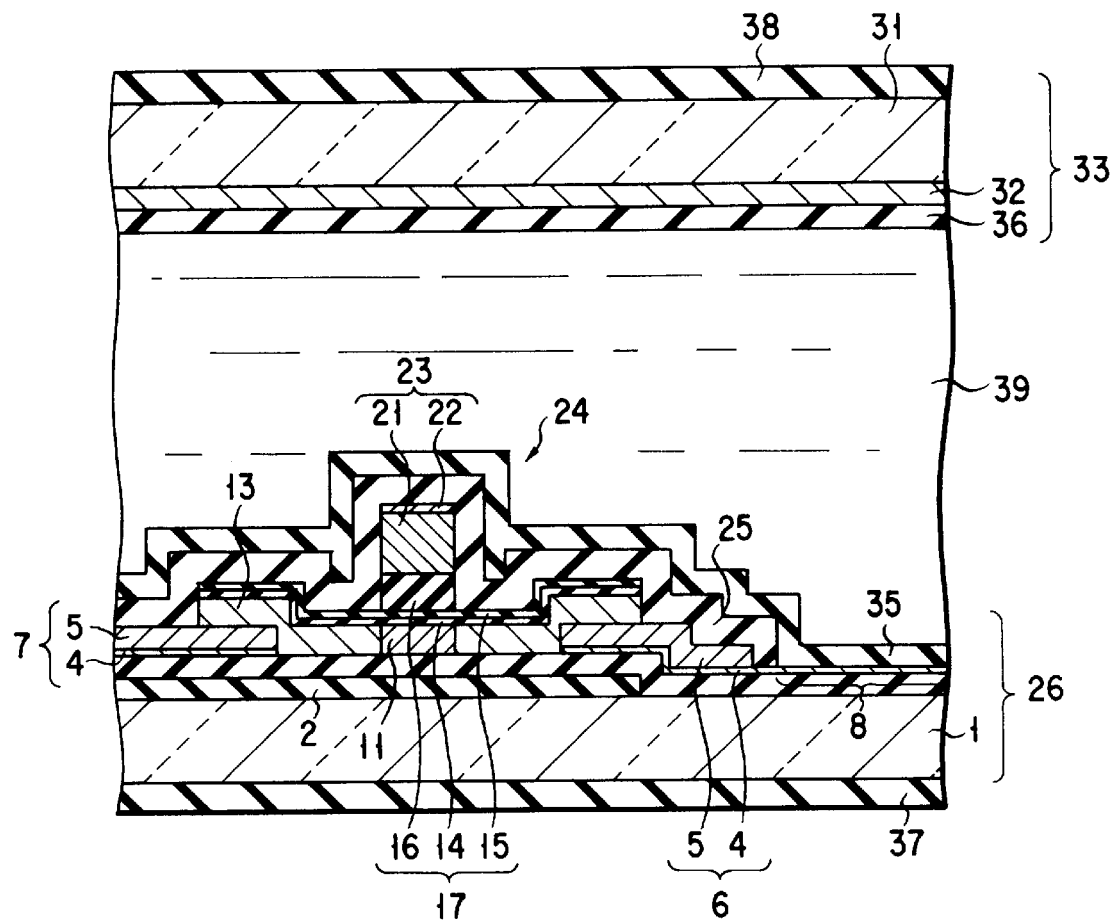
F I G. 1
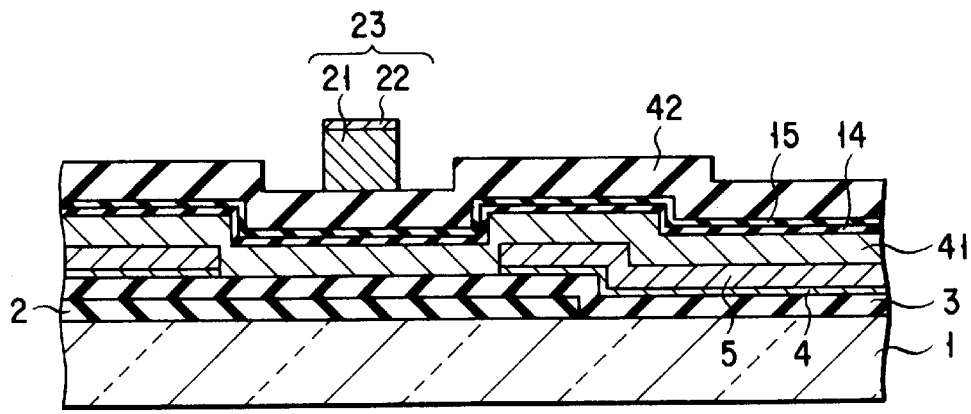
F I G. 2

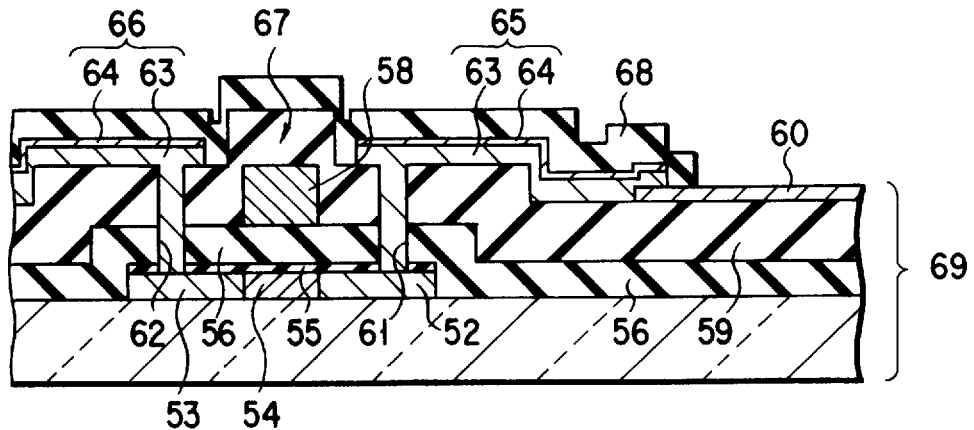
F I G. 7
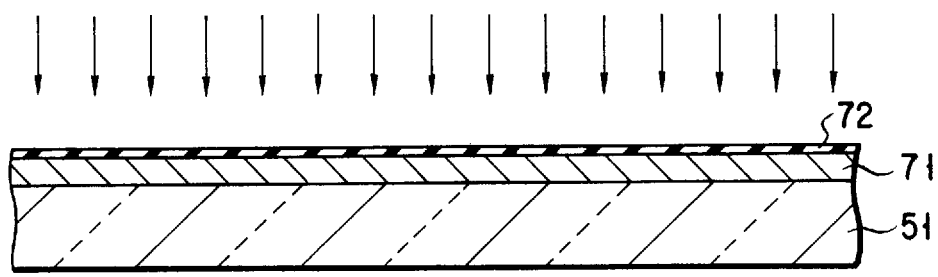
F I G. 8
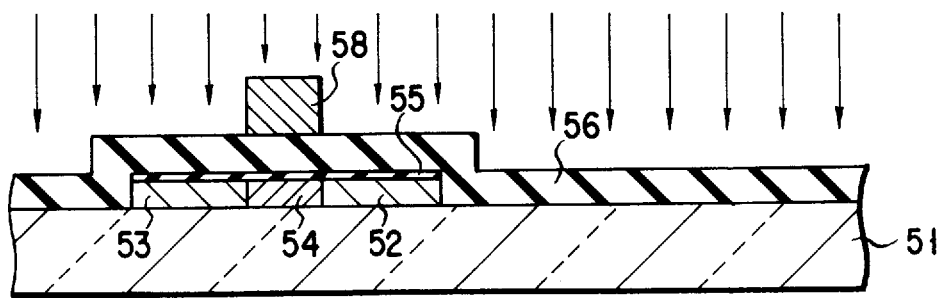
F I G. 9

METHOD OF FORMING A POLYCRYSTALLINE SILICON LAYER, A THIN FILM TRANSISTOR HAVING THE POLYCRYSTALLINE SILICON LAYER, METHOD OF MANUFACTURING THE SAME, AND A LIQUID CRYSTAL DISPLAY DEVICE HAVING THE THIN FILM TRANSISTOR

BACKGROUND OF THE INVENTION

1. Field of the Invention

This invention relates to a method of forming a polycrystalline silicon layer by utilizing a laser annealing process, a top-gate type thin film transistor having a gate electrode disposed over the polycrystalline silicon layer, a method of manufacturing the thin film transistor, and a liquid crystal display device using the thin film transistor as a switching element.

2. Description of the Related Art

Generally, an active matrix type liquid crystal display device has an array substrate on which a plurality of pixel electrodes are arrayed in a matrix form, a counter substrate having a counter electrode disposed to face the pixel electrodes, and a liquid crystal layer disposed between the array substrate and the counter substrate. The pixel electrodes are respectively connected to a plurality of thin film transistors formed as switching elements on the array substrate. Each of the thin film transistors is controlled by an external driving circuit to selectively supply a signal voltage to a corresponding one of the pixel electrodes. In recent years, the top-gate type thin film transistors are used in the liquid crystal display device. The thin film transistor has a normal staggered structure in which the gate electrode is formed over a semiconductor layer with an gate insulator disposed therebetween. Since the normal staggered structure permits the wiring resistance and the number of masks used to be reduced, it is advantageous over the conventional inverted staggered structure from the viewpoint of an increase in the size of the liquid crystal display device and enhancement of the productivity.

Now, the manufacturing process of the thin film transistor is schematically explained. First, a glass substrate is prepared, source electrodes and drain electrodes are formed on the glass substrate, and a non-single crystal semiconductor layer, for example, amorphous silicon (a-Si:H) layer is formed in contact with the source electrodes and drain electrodes on the glass substrate. After this, an insulating film and a metal film are formed on the amorphous silicon layer and they are patterned on the amorphous silicon layer by $CF_4/O_2$ gas mixture dry-etching so as to selectively leave portions thereof as gate insulation films and gate electrodes, respectively. If the wet etching is effected at this time, the gate insulation film is side-etched along the outer periphery of the gate electrode to deteriorate the operation characteristic of the thin film transistor. The dry etching is effective to prevent the deterioration in the characteristic. After the patterning, impurity is doped into the amorphous silicon layer by using the gate electrode as a mask and the impurity-doped region of the amorphous silicon layer is crystallized as a polycrystalline silicon layer of low resistance by the laser annealing process to form a pair of ohmic contact portions. Since the ohmic contact portions are formed in self-alignment with the gate electrode, parasitic capacitances of the thin film transistor between the gate and the source and between the gate and the drain are reduced. If the external driving circuit is also provided in the array substrate, thin film transistors having a high-speed response are used to construct the driving circuit. In this case, a laser beam is applied to the whole portion of the amorphous silicon layer prior to formation of the gate electrode and gate insulation film so as to change the active layer below the gate electrode into a polycrystalline form.

The above laser annealing process is effected by use of an excimer laser annealing system, for example, to uniformly change the amorphous silicon layer into a polycrystalline form without thermally damaging the substrate by application of pulse. The system generates an excimer laser beam as an intermittent pulse with an oscillation frequency of several hundred Hz and repeatedly scans the amorphous silicon layer with the excimer laser beam. Since the impurity-doped region is not masked with the gate electrode, the region is exposed to the excimer laser beam. In a portion to which the laser beam is applied, hydrogen contained in amorphous silicon is ablated, thereby causing amorphous silicon to be changed into a polycrystalline form. If the thickness of the amorphous silicon layer is approx. 100 nm, for example, it is necessary to apply the excimer laser beam with the energy density of 150 to 160 $mJ/cm^2$ or more.

The manufacturing process for the above liquid crystal display device has the following problem.

Since an output power of the present excimer laser annealing system is approx. 200W, the annealing system cannot generate a laser beam with a sufficiently large beam diameter without lowering the oscillation frequency. It cannot be expected to increase the output power of the annealing system itself because of technical difficulty. Therefore, the amorphous silicon layer must be repeatedly scanned with the laser beam in the laser annealing process, causing the throughput of the laser annealing process to be lowered. Recently, the size of the array substrate tends to increase with an increase in the demand of a large-screen liquid crystal display device, causing the throughput of the laser annealing process to be further lowered.

Further, in the above dry etching, it is necessary to provide a sufficiently large difference in etching rate between the gate insulation film and the amorphous silicon layer. For example, a silicon nitride film has an excellent insulating property, but in this case, it is impossible to provide a preferable etching rate difference with respect to the amorphous silicon layer in the $CF_4/O_2$ gas mixture dry-etching process. Therefore, it is difficult to complete the etching process before the surface portion of the amorphous silicon layer is partly removed. As a result, it becomes impossible to use silicon nitride as a gate insulating material.

Further, the ion doping process and laser annealing process are effected while both of the amorphous silicon layer and the gate electrode are exposed. At this time, since the outer peripheral portion of the gate electrode is separated from the amorphous silicon layer whose resistance is made low by polycrystallization only by a thickness of the gate insulator, there occurs a strong possibility that they are brought into contact with each other for some reason and electrically connected to each other.

SUMMARY OF THE INVENTION

An object of this invention is to provide a method of forming a polycrystalline silicon layer which can enhance the throughput of the laser annealing process, a thin film transistor containing the polycrystalline silicon layer, a method of manufacturing the thin film transistor, and a liquid crystal display device having the thin film transistor.

Another object of this invention is to provide a thin film transistor capable of preventing the short circuit between source and drain contact regions and a gate electrode disposed adjacent to each other with a gate insulator disposed therebetween, a method of manufacturing the thin film transistor, and a liquid crystal display device having the thin film transistor.

According to a first aspect of this invention, there is provided a method of forming a polycrystalline silicon layer, comprising the steps of forming a non-single crystal silicon layer; forming a reflectivity reducing film on the non-single crystal silicon layer to reduce the optical reflectivity of the non-single crystal silicon layer; and changing the non-single crystal silicon layer into a polycrystalline silicon form by an annealing process for applying a laser beam to the non-single crystal silicon layer via the reflectivity reducing film. According to the above polycrystalline silicon layer forming method, the amount of laser light absorbed in the non-single crystal silicon layer can be increased and the non-single crystal silicon layer can be efficiently changed into a polycrystalline form.

According to a second aspect of this invention, there is provided a thin film transistor comprising a non-single crystal silicon layer formed on an insulating substrate; a gate insulator formed on the non-single crystal silicon layer; a gate electrode formed on the gate insulator; source and drain contact regions of polycrystalline silicon formed in the non-single crystal silicon layer on both sides of the gate electrode; and source and drain electrodes formed respectively in contact with the source and drain contact regions; wherein the gate insulator includes a first insulating film which covers at least the source and drain contact regions. According to the thin film transistor, it is possible to efficiently change the non-single crystal silicon layer into a polycrystalline form in the laser annealing process for forming the source and drain contact regions, for example, by forming the first insulating film as a reflectivity reducing film.

According to a third aspect of this invention, there is provided a method of manufacturing a thin film transistor, comprising the steps of forming a non-single crystal silicon layer on a substrate; forming a gate insulator on the non-single crystal silicon layer; forming a gate electrode on the gate insulator; forming source and drain contact regions of polycrystalline silicon in the non-single crystal silicon layer on both sides of the gate electrode; and forming source and drain electrodes in contact with the source and drain contact regions; wherein the gate insulator forming step includes a step of forming a first insulating film which covers the non-single crystal silicon layer as a reflectivity reducing film for reducing the optical reflectivity of the non-single crystal silicon layer; and the contact region forming step includes a step of changing the non-single crystal silicon layer into a polycrystalline form as the source and drain contact regions by the annealing process for applying a laser beam to the non-single crystal silicon layer via the first insulating film. According to the thin film transistor manufacturing method, the reflectivity reducing film is formed to cover the non-single crystal silicon layer and the laser beam is applied to the non-single crystal silicon layer via the reflectivity reducing film. The annealing process permits the non-single crystal silicon layer to be efficiently changed into a polycrystalline form as the source and drain contact regions.

According to a fourth aspect of this invention, there is provided a liquid crystal display device comprising an array substrate having thin film transistors formed thereon; a counter substrate disposed to face the array substrate; and a liquid crystal layer held between the array substrate and the counter substrate; wherein the thin film transistor has a non-single crystal silicon layer formed on an insulating substrate; a gate insulator formed on the non-single crystal silicon layer; a gate electrode formed on the gate insulator; source and drain contact regions of polycrystalline silicon formed in the non-single crystal silicon layer on both sides of the gate electrode; and source and drain electrodes formed respectively in contact with the source and drain contact regions; and the gate insulator includes a first insulating film which covers at least the source and drain contact regions. According to the liquid crystal display device, the same effect as that obtained in the thin film transistor can be attained.

That is, the polycrystalline silicon layer forming method permits the throughput of the laser annealing process to be enhanced. Further, the thin film transistor, the thin film transistor manufacturing method and the liquid crystal display device can permit the throughput of the laser annealing process to be enhanced, and prevent the gate electrode from being short-circuited to the source and drain contact regions which are formed adjacent to each other with the gate insulator disposed therebetween.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross sectional view schematically showing the structure of an active matrix type liquid crystal display device according to a first embodiment of this invention;

FIG. 2 is a cross sectional view showing one manufacturing step of a liquid crystal display device shown in FIG. 1;

FIG. 7 is a cross sectional view showing a modification of an array substrate shown in FIG. 1;

FIG. 8 is a cross sectional view showing one manufacturing step of an array substrate shown in FIG. 7;

FIG. 9 is a cross sectional view showing a manufacturing step effected after the manufacturing step shown in FIG. 8;

DETAILED DESCRIPTION OF THE PREFERRED EMBODIMENTS

Figure 3:
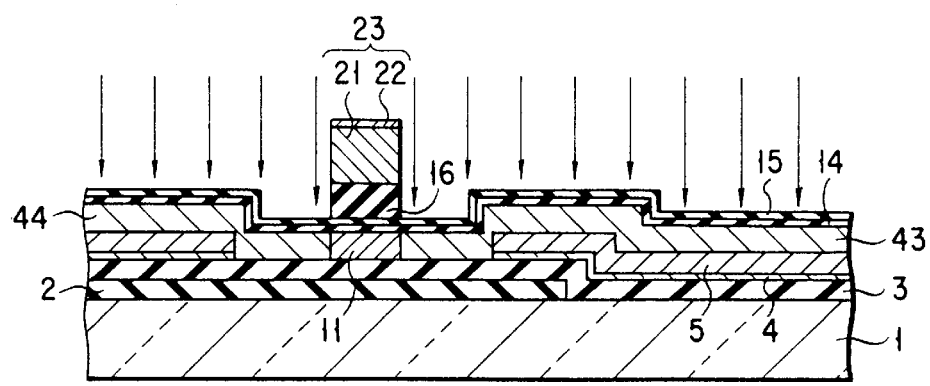
FIG. 3 is a cross sectional view showing a manufacturing step effected after the manufacturing step shown in FIG. 2.

There will now be described an active matrix type liquid crystal display device according to a first embodiment of this invention with reference to FIGS. 1 to 6.

FIG. 1 shows the cross section of the liquid crystal display device. The liquid crystal display device includes an array substrate 26 having a plurality of pixel electrodes 8 arrayed in a matrix form, a counter substrate 33 having a counter electrode 32 formed to face the pixel electrodes 8, a liquid crystal layer 39 held between the array substrate 26 and the counter substrate 33, and polarizers 37 and 38 respectively attached to the surfaces of the array substrate 26 and the counter substrate 33 which lie on the opposite sides with respect to the liquid crystal layer 39. The plurality of pixel electrodes 8 are respectively connected to a plurality of top-gate type thin film transistors 24 which are formed as switching elements on the array substrate 26. Each of the thin film transistors 24 is controlled by an external driving circuit to selectively supply a signal voltage to a corresponding one of the pixel electrodes 8 and has a source electrode 6 connected to the corresponding pixel electrode 8, a drain electrode 7 connected to the external driving circuit to receive a signal voltage, and a gate electrode 23 connected to the external driving circuit to receive a driving voltage.

The array substrate 26 has a glass substrate 1 (for example, product number 1737 of Corning Co.) prepared as an insulating substrate, a black matrix film 2 of chrome formed on one main surface of the glass substrate 1, an insulating film 3 of silicon nitride (SiN) formed on the black matrix film 2 and glass substrate 1. Each of the source electrode 6 and drain electrode 7 of the thin film transistor 24 has a two-layered structure constructed by a transparent conductive film 4 of ITO (Indium Tin Oxide) formed on the insulating film 3 and a metal film 5 of molybdenum-tungsten alloy formed on the transparent conductive film 4. The pixel electrode 8 is formed on that portion of the insulating film 3 under which the black matrix film 2 is not present and is commonly constructed by the transparent conductive film 4 which is also used to construct part of the adjacent source electrode 6.

The array substrate 26 includes a semiconductor layer 11 of amorphous silicon (a-Si:H) formed on the insulating film 3 in substantially a central portion between the source electrode 6 and the drain electrode 7, and n-type polycrystalline silicon semiconductor layers 12 and 13 formed on both sides of the semiconductor layer 11 as source and drain contact regions. The source and drain electrodes 6 and 7 are electrically connected to the semiconductor layer 11 via the semiconductor layers 12 and 13, respectively. The array substrate 26 further includes a gate insulator 17 formed on the semiconductor layer 11 and a gate electrode 23 formed on the gate insulator 17. The gate insulator 17 has a three-layered structure constructed by a silicon nitride (SiN) film 14 formed on the semiconductor layers 11, 12 and 13, a silicon oxide ($SiO_2$) film 15 formed on the silicon nitride film 14, and a silicon nitride film 16 formed on that portion of the silicon oxide film 15 below which the semiconductor layer 11 is formed. The gate electrode 23 has a two-layered structure constructed by an aluminum (Al) film 21 formed on the silicon nitride film 16 and a molybdenum (Mo) film 22 formed on the aluminum film 21. The array substrate 26 has an insulating passivation film 25 of silicon nitride (SiN) which covers the whole portion of the above structures and a polyimide film 35 entirely covering the insulating passivation film and used as an orientation film.

The counter substrate 33 has a glass substrate 31 (for example, product number 1737 of Corning Co.) prepared as an insulating substrate, a counter electrode 32 formed of a transparent conductive film such as ITO and formed on one main surface of the glass substrate 31, and a polyimide film 36 entirely covering the counter electrode 32 and used as an orientation film.

The liquid crystal layer 39 is formed of a liquid crystal containing material and is held between the array substrate 26 and the counter substrate 33. The polarizers 37 and 38 are disposed on the outside surfaces of the array substrate 26 and the counter substrate 33, respectively.

The manufacturing process of the liquid crystal display device according to the first embodiment is explained below.

In the manufacturing step shown in FIG. 2, a black matrix film 2 is formed on one main surface of a glass substrate 1 and an insulating film 3 is formed on the black matrix film 2 and the exposed portion of the glass substrate 1. Then, a transparent conductive film 4 of ITO and a metal film 5 of molybdenum-tungsten alloy are sequentially formed by use of a sputtering system and are selectively etched by photolithography to form a pixel electrode 8, source electrode 6 and drain electrode 7. Next, an amorphous silicon layer 41, nitride silicon film 14, silicon oxide film 15, and silicon nitride film 42 are sequentially formed by use of a plasma CVD system. The source electrode 6, drain electrode 7 and pixel electrode 8 are covered with the amorphous silicon layer 41 of 100 nm. The amorphous silicon layer 41 is covered with the silicon nitride film 14 of 10 nm. The silicon nitride film 14 is covered with the silicon oxide film 15 of 10 nm. The silicon oxide film 15 is covered with the silicon nitride film 42 of 400 nm. Then, an aluminum film 21 and molybdenum film 22 are sequentially formed by use of a sputtering system and are selectively etched by photolithography using a resist pattern to form a gate electrode 23.

In the manufacturing step shown in FIG. 3, the silicon nitride film 42 is selectively etched by use of the above resist pattern again. As a result, a silicon nitride film 16 is left under the gate electrode 23 and the silicon oxide film 15 except a portion thereof lying under the silicon nitride film 16 is exposed. After this, the resist pattern is removed from the upper surface of the gate electrode 23 and the impurity doping process is effected with the gate electrode 23 used as a mask. In the doping process, phosphorus (P) is doped into the amorphous silicon layer 41 with the dose amount of $3 \times 10^{15}/cm^2$ by an ion doping system. The ion doping system accelerates phosphorus with an acceleration voltage of 60 kV to dope phosphorus into the amorphous silicon layer 41 via the silicon oxide film 15 and silicon nitride film 14. The doping process causes part of the amorphous silicon layer 41 which is not masked by the gate electrode 23 to be changed into n-type amorphous silicon layers 43 and 44.

Figure 4:
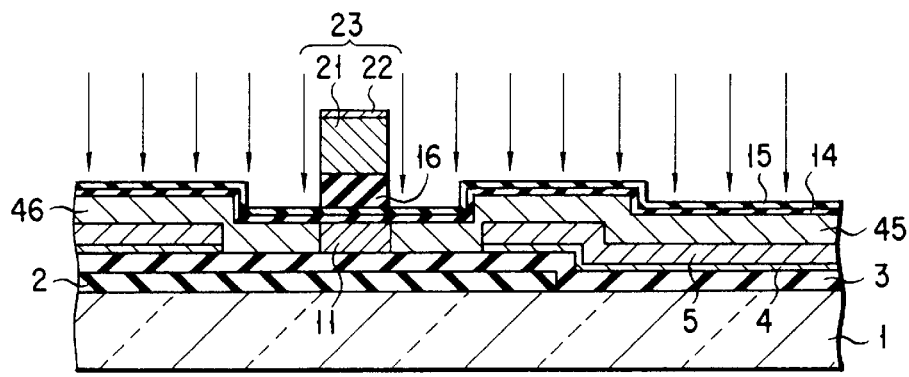
FIG. 4 is a cross sectional view showing a manufacturing step effected after the manufacturing step shown in FIG. 3.

In the manufacturing step shown in FIG. 4, a KrF excimer laser beam of wavelength 248 nm is generated from the excimer laser system and applied from above the silicon oxide film 15 with an energy density of 70 $mJ/cm^2$ so as to change the n-type amorphous silicon layers 43 and 44 into a polycrystalline form as n-type polycrystalline silicon layers 45 and 46, respectively. In this case, the silicon nitride film 14 and silicon oxide film 15 are also used as a reflectivity reducing film for reducing the reflectivities of the n-type amorphous silicon layers 43 and 44 with respect to the excimer laser beam.

Figure 5:
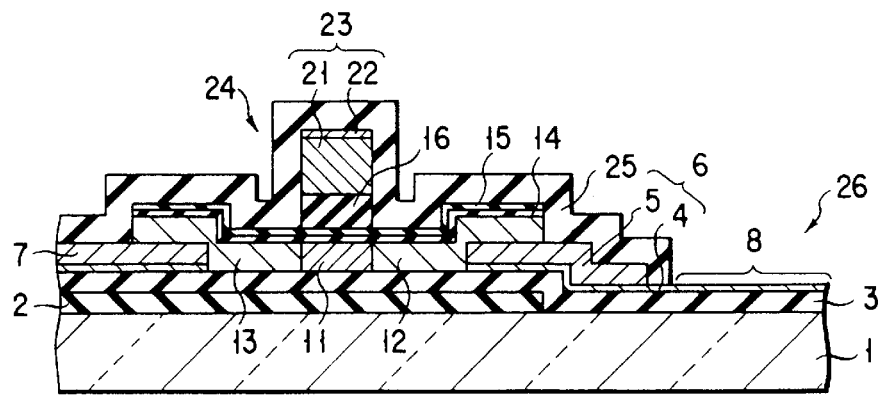
FIG. 5 is a cross sectional view showing a manufacturing step effected after the manufacturing step shown in FIG. 4.

In the manufacturing step shown in FIG. 5, the n-type polycrystalline silicon layers 45 and 46 are selectively etched by photolithography to form the semiconductor layers 12 and 13 which are used as source and drain contact regions. Then, an insulating passivation film 25 of silicon nitride is formed by a plasma CVD system to cover the entire portion of the above structure. Further, the insulating passivation film 25 is removed from the upper surface of the pixel electrode 8 together with the opaque metal film 5 of molybdenum-tungsten alloy by photolithography. After this, a polyimide film 35 is formed to cover the insulating passivation film 25 and pixel electrodes 8. The array substrate 26 is formed in the above-described manner.

In the case of the counter substrate 33, a counter electrode 32 of ITO is formed on a glass substrate 31 as shown in FIG. 1, and then a polyimide film 36 is formed to cover the counter electrode 32.

After the array substrate 26 and counter substrate 33 are thus formed, they are placed with the polyimide films 35 and 36 set to face each other, a liquid crystal containing material is sealed into between the array substrate 26 and the counter substrate 33 as a liquid crystal layer 39 and polarizers 37 and 38 are respectively attached to the surface of the array substrate 26 which lies on the opposite side with respect to the polyimide film 35 and to the surface of the counter substrate 33 which lies on the opposite side with respect to the polyimide film 36.

Figure 6:
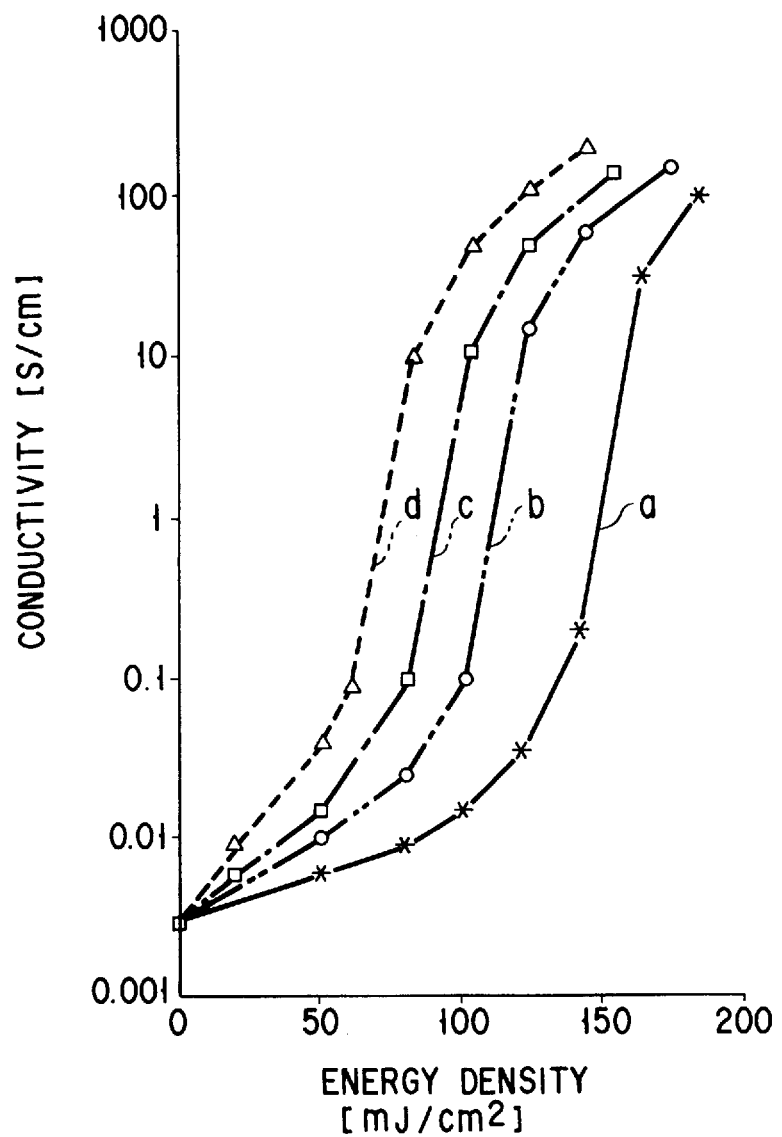
FIG. 6 is a graph showing the relation between the energy density of laser beam applied in the laser annealing process effected in the manufacturing step shown in FIG. 4 and the electrical conductivity of a non-single crystal silicon layer formed by the annealing process using the laser beam.

The laser annealing process effected in the manufacturing step shown in FIG. 4 is explained in detail. FIG. 6 is a graph showing the relation between the energy density of laser beam applied when a sample of amorphous silicon is subjected to the laser annealing process and the electrical conductivity of a non-single crystal silicon layer formed by the annealing process using the laser beam. The relation is derived from the results of experiments in which four samples a, b, c and d are subjected to the laser annealing process. The sample a is a structure obtained by forming an amorphous silicon layer with a thickness of 100 nm on a glass substrate and doping impurity of phosphorus into the amorphous silicon layer with the surface density of $3 \times 10^{15}/cm^2$. The sample b is a structure obtained by forming a silicon nitride film of 10 nm on the amorphous silicon layer of the sample a. The sample c is a structure obtained by forming a silicon oxide film of 10 nm on the amorphous silicon layer of the sample a. The sample d is a structure obtained by forming a silicon nitride film of 10 nm on the amorphous silicon layer of the sample a and forming a silicon oxide film of 10 nm on the silicon nitride film. In this case, the glass substrate is the product number 1737 of Corning Co., phosphorus impurity is doped by an ion doping system, and the amorphous silicon layer, silicon nitride film and silicon oxide film are formed by a plasma CVD system. In the laser annealing process, a KrF excimer laser beam of wavelength 248 nm was applied from above to the samples a, b, c and d to change the amorphous silicon layer into a polycrystalline form. That is, the amorphous silicon layer was annealed by the excimer laser beam directly applied thereto in the sample a, the amorphous silicon layer was annealed by the excimer laser beam applied thereto via the silicon nitride film in the sample b, the amorphous silicon layer was annealed by the excimer laser beam applied thereto via the silicon oxide film in the sample c, and the amorphous silicon layer was annealed by the excimer laser beam applied thereto via the silicon nitride film and silicon oxide film in the sample d. As a result of the annealing process, the amorphous silicon layer is changed into a polycrystalline form.

If the surface reflectivity with which the surface of the sample a reflects the laser beam (KrF) of wavelength 248 nm is 100%, the reflectivities of the samples b, c and d are respectively approx. 80%, 70% and 45%. Further, the optical densities of the silicon nitride film with the thickness of 10 nm, the silicon oxide film with the thickness of 10 nm and the laminated structure of the silicon nitride film with the thickness of 10 nm and the silicon oxide film with the thickness of 10 nm are 0.1 or less. The optical density OD can be expressed by an equation OD=log Io/I (where I=Io exp(−αD), Io: the intensity of incident light on the structure, I: the intensity of emission light from the structure, D: the thickness of the structure, α: constant).

Referring to FIG. 6, since the density of phosphorus is common to the amorphous silicon layers of the samples a, b, c and d, the electric conductivities of the amorphous silicon layers become higher as the energy density of the excimer laser beam increases.

As shown in FIG. 6, in the sample a, the electric conductivity thereof is rapidly increased when the energy density lies between 140 and 160 mJ/cm$^2$. This means that a change of amorphous silicon into a polycrystalline form is started. On the other hand, in the samples, b, c and d, the electric conductivities thereof are rapidly increased when the energy densities thereof lie between 100 and 120 mJ/cm$^2$, 80 and 100 mJ/cm$^2$ and 60 and 80 mJ/cm$^2$, respectively. That is, the amorphous silicon layer of each of the samples b, c and d is started to be changed into a polycrystalline form with a lower energy density of excimer laser beam than the amorphous silicon layer of the sample a. Particularly, in a case where the amorphous silicon layer is annealed by the excimer laser beam applied via the silicon nitride film of 10 nm and the silicon oxide film of 10 nm as in the case of sample d, the electric conductivity of the amorphous silicon layer thereof is rapidly increased with the energy density substantially half that in the case of the amorphous silicon of the sample a and the amorphous silicon is changed into a polycrystalline form. Thus, use of the laminated structure of the silicon nitride film and silicon oxide film can enhance the energy efficiency of the laser beam applied to the amorphous silicon layer in comparison with a case where a single layer of the silicon nitride film or silicon oxide film is used.

In the first embodiment, the laminated structure of the silicon nitride film 14 and silicon oxide film 15 is used as a reflectivity reducing film based on the results of the above experiments. However, it is also possible to use a single layer of the silicon nitride film 14 or silicon oxide film 15 as a reflectivity reducing film. The important thing is that, for example, the silicon nitride film 14, the silicon oxide film 15, the two-layered structure of the silicon nitride film 14 and silicon oxide film 15, or another reflectivity reducing film is formed on the non-single crystal silicon layer such as the amorphous silicon layer 41 before the laser annealing process is effected. In this case, it is preferable to select the film thickness of the reflectivity reducing film such that the surface reflectivity with respect to the wavelength of the laser beam applied will be set to the smallest value.

Further, the non-single crystal silicon layer, that is, the amorphous silicon layer 41 is formed to contain hydrogen (H) by use of a plasma CVD system. The amorphous silicon layer 41 is changed into a polycrystalline form by ablation of hydrogen in the laser annealing process. The ablation of hydrogen occurs more rapidly as the reflectivity reducing film becomes thinner. Particularly, since the silicon nitride film is difficult to pass hydrogen, it is preferable to set the thickness of the silicon nitride film to 20 nm or less. When the laminated structure of the silicon nitride film and silicon oxide film is used as a reflectivity reducing film, it is preferable to set the thickness of the laminated structure to 40 nm or less.

In the first embodiment, the reflectivity reducing film is formed of the silicon nitride film 14 formed on the amorphous silicon layer 41 and the silicon oxide film 15 formed on the silicon nitride film 14. This is because amorphous silicon can form a better interface with silicon nitride than with silicon oxide. Further, the reflectivity reducing film constructs part of the gate insulator 17. In this case, it is preferable to set the film thickness of the silicon nitride film 14 to 5 nm or more in order to form a good interface irrespective of the film quality of silicon oxide. When both of the ablation of hydrogen and formation of the interface are taken into consideration, it is particularly preferable to set the film thickness of the silicon nitride film 14 in a range of 5 nm to 20 nm. In this case, use of the laminated structure of the silicon oxide film 15 and silicon nitride film 14 will also reduce the surface reflectivity of the amorphous silicon layer 41 with respect to the wavelength of the laser beam in a wide range. Further, when emphasis is put on formation of a good interface, it is preferable to use a single layer of the silicon nitride film 14 as the reflectivity reducing film.

The amorphous silicon layer 41 contains phosphorus as impurity doped prior to the laser annealing process in the first embodiment. However, even if the amorphous silicon layer 41 does not contain the impurity, the amorphous silicon layer 41 can be changed into a polycrystalline form with a lower energy density when the amorphous silicon layer 41 is annealed by an excimer laser beam applied via the silicon nitride film, silicon oxide film or the laminated structure of these films than when the amorphous silicon layer 41 is annealed by an excimer laser beam directly applied.

According to the first embodiment, the reflectivity reducing film is formed on the amorphous silicon layer 41 and the amorphous silicon layer 41 is annealed by a laser beam applied via the reflectivity reducing film. The reflectivity reducing film reduces the surface reflection to increase an amount of laser energy absorbed in the amorphous silicon layer 41. For this reason, even if the laser annealing system has the same power as the conventional system, it becomes possible to enlarge the spot area of the laser beam applied and reduce time for scanning the substrate. Therefore, the throughput of the laser annealing process can be enhanced.

Further, the top-gate type thin film transistor 24 has a normal staggered structure in which the gate electrode 23 is formed over the semiconductor layer 11 of amorphous silicon with the gate insulator 17 disposed therebetween. In this case, the semiconductor layers 13 and 14 of the source and drain contact regions which are set in self-alignment with the gate electrode 23 can be formed by using the gate electrode 23 as a mask in the process of doping impurity and applying the laser beam. Therefore, the semiconductor layers 13 and 14 can be formed sufficiently close to each other without overlapping the gate electrode 23.

The optical density of the reflectivity reducing film is set to 0.1 or less. In this case, the amount of energy of the laser beam absorbed in the reflectivity reducing film is extremely small and a larger amount of energy can be stable absorbed into the amorphous silicon layer 41 in comparison with a case where the reflectivity reducing film is not formed. That is, the efficiency of application of laser energy is enhanced.

A modification of the array substrate shown in FIG. 1 is explained with reference to FIGS. 7 to 10.

FIG. 7 schematically shows the cross sectional structure of an array substrate 69 of the modification. The array substrate 69 is used when the black matrix film 2 shown in FIG. 1 is formed on the counter substrate 33 side. In the array substrate 69, a plurality of pixel electrodes 60 are arrayed in a matrix form and connected to a plurality of top-gate type thin film transistors 67 which are formed on the array substrate 69 as switching elements. Each of the thin film transistors 67 is controlled by an external driving circuit to selectively supply a signal voltage to a corresponding one of the pixel electrodes 60 and has a source electrode 65 connected to the corresponding pixel electrode 60, a drain electrode 66 connected to the external driving circuit to receive a signal voltage, and a gate electrode 58 connected to the external driving circuit to receive a driving voltage.

The array substrate 69 has a glass substrate 51 (for example, product number 1737 of Corning Co.) prepared as an insulating substrate, semiconductor layers 52 and 53 of n-type polycrystalline silicon formed on one main surface of the glass substrate 51 and respectively serving as source and drain contact regions, a semiconductor layer 54 of amorphous silicon formed between the semiconductor layers 52 and 53, a silicon oxide ($SiO_2$) film 55 formed as a reflectivity reducing film on the semiconductor layers 52, 53 and 54, and a silicon oxide ($SiO_2$) film 56 formed to entirely cover the silicon oxide film 55. The silicon oxide films 55 and 56 constitute a gate insulator. The gate electrode 58 is formed of molybdenum-tantalum alloy on the silicon oxide film 56 in position corresponding to the semiconductor layer 54. The silicon oxide film 56 and the gate electrode 58 are entirely covered with an inter-level insulating layer 59 of silicon oxide ($SiO_2$). The pixel electrode 60 is formed of ITO on that portion of the inter-level insulating film 59 below which the semiconductor layers 52, 53 and 54 are not present. The source electrode 65 and drain electrode 66 are formed of two aluminum (Al) layers 63 formed on the inter-level insulating film 59 and respectively formed in contact with the semiconductor layers 52 and 53 via contact holes 61 and 62, and molybdenum films (Mo) 64 respectively formed on the aluminum layers 63. The source electrode 65, drain electrode 66 and inter-level insulating film 59 are covered with a passivation film 68 of silicon nitride (SiN). Further, the array substrate also includes a polyimide film and polarizers (not shown) like the array substrate of FIG. 1.

The process of manufacturing the array substrate 69 is explained, below.

In the manufacturing step shown in FIG. 8, an amorphous silicon layer 71 with a thickness of 50 nm is formed on one main surface of a glass substrate 51 by use of a plasma CVD system and a silicon oxide film 72 with a thickness of 10 nm is formed to cover the amorphous silicon layer 71. Then, a KrF excimer laser beam of wavelength 248 nm is generated from the excimer laser system and applied from above the silicon oxide film 72 with an energy density of 130 $mJ/cm^2$ so as to change the amorphous silicon layer 71 into a polycrystalline silicon layer 71. In this case, the silicon oxide film 72 is used as a reflectivity reducing film for reducing the reflectivity of the silicon layer 71 with respect to the KrF excimer laser beam.

In the manufacturing step shown in FIG. 9, the polycrystalline silicon layer 71 and silicon oxide film 72 are selectively etched by use of the same resist pattern. Then, a silicon oxide film 56 with a thickness of 60 nm is formed on the polycrystalline silicon layer 71 and the exposed portion of the glass substrate 51 by a plasma CVD system. After this, a molybdenum-tantalum alloy film is formed on the silicon oxide film 56 by a sputtering system and selectively etched by photolithography using a resist pattern so as to form a gate electrode 58. After formation of the gate electrode 58, the resist pattern is removed and an impurity doping process is effected with the gate electrode 58 used as a mask. In the doping process, phosphorus (P) is doped into the polycrystalline silicon layer 71 with the dose amount of $3 \times 10^{15}/cm^2$ by use of an ion doping system. The ion doping system accelerates phosphorus with an acceleration voltage of 80 kV to dope phosphorus into the polycrystalline silicon layer 71 via the silicon oxide films 55 and 56. The doping process causes part of the amorphous silicon layer 71 which is not masked by the gate electrode 58 to be changed into semiconductor layers 52 and 53 of n-type polycrystalline silicon which are respectively used as source and drain contact regions and causes part of the amorphous silicon layer 71 which lies between the semiconductor layers 52 and 53 to be changed into a semiconductor layer 54. At this time, the semiconductor layers 52 and 53 are formed in self-alignment with the gate electrode 58.

Figure 10:
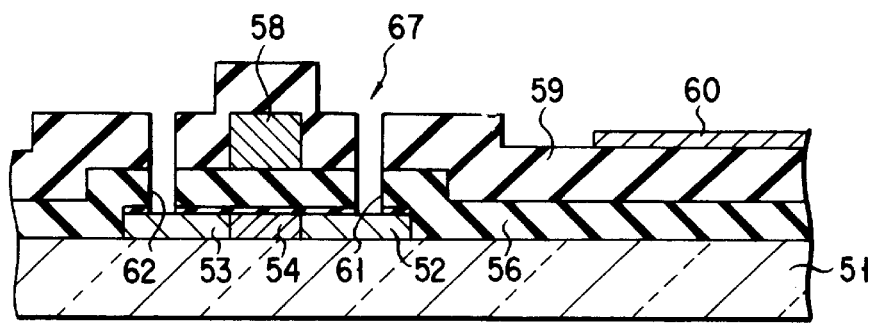
FIG. 10 is a cross sectional view showing a manufacturing step effected after the manufacturing step shown in FIG. 9.

In the manufacturing step shown in FIG. 10, an inter-level insulating layer 59 of silicon oxide is formed by a plasma CVD system to cover the gate electrode 58 and the exposed portion of the silicon oxide film 56. Then, doped phosphorus is thermally activated at 600° C., a transparent conductive film of ITO is formed on the inter-level insulating film 59 by a sputtering system and selectively etched by photolithography to form a pixel electrode 60. Further, the silicon oxide film 56 and inter-level insulating layer 59 are selectively etched to form contact holes 61 and 62 therein.

In the next manufacturing step, as shown in FIG. 7, an aluminum layer 63 and molybdenum layer 64 are sequentially formed by a sputtering system and selectively etched by photolithography to form the source electrode 65 and drain electrode 66. The source electrode 65, drain electrode 66 and inter-level insulating layer 59 are covered with a passivation film 68 of silicon nitride formed by a plasma CVD system and the protection layer 68 is selectively etched by photolithography to expose the pixel electrode 60 together with the peripheral electrodes thereof.

According to the above modification, the silicon oxide film 72 is formed as a reflectivity reducing film on the amorphous silicon layer 71, and the amorphous silicon layer 71 is annealed by a laser beam applied via the reflectivity reducing film. The reflectivity reducing film suppresses the surface reflection to increase the laser energy absorbed in the amorphous silicon layer 71. For this reason, even if the laser annealing system has the same power as the conventional system, it becomes possible to enlarge the spot area of the laser beam applied and reduce time for scanning the array substrate. Therefore, the throughput of the laser annealing process can be enhanced.

Further, the top-gate type thin film transistor 67 has a normal staggered structure in which the gate electrode 58 is formed over the semiconductor layer 54 of polycrystalline silicon with the gate insulator 56 disposed therebetween. In this case, the semiconductor layers 52 and 53 of the source and drain contact regions which are set in self-alignment with the gate electrode 58 can be formed by using the gate electrode 58 as a mask in the impurity doping process. Therefore, the semiconductor layers 52 and 53 can be formed sufficiently close to each other without overlapping the gate electrode 58.

An active matrix type liquid crystal display device according to a second embodiment of this invention is explained below, with reference to FIG. 11.

Figure 11:
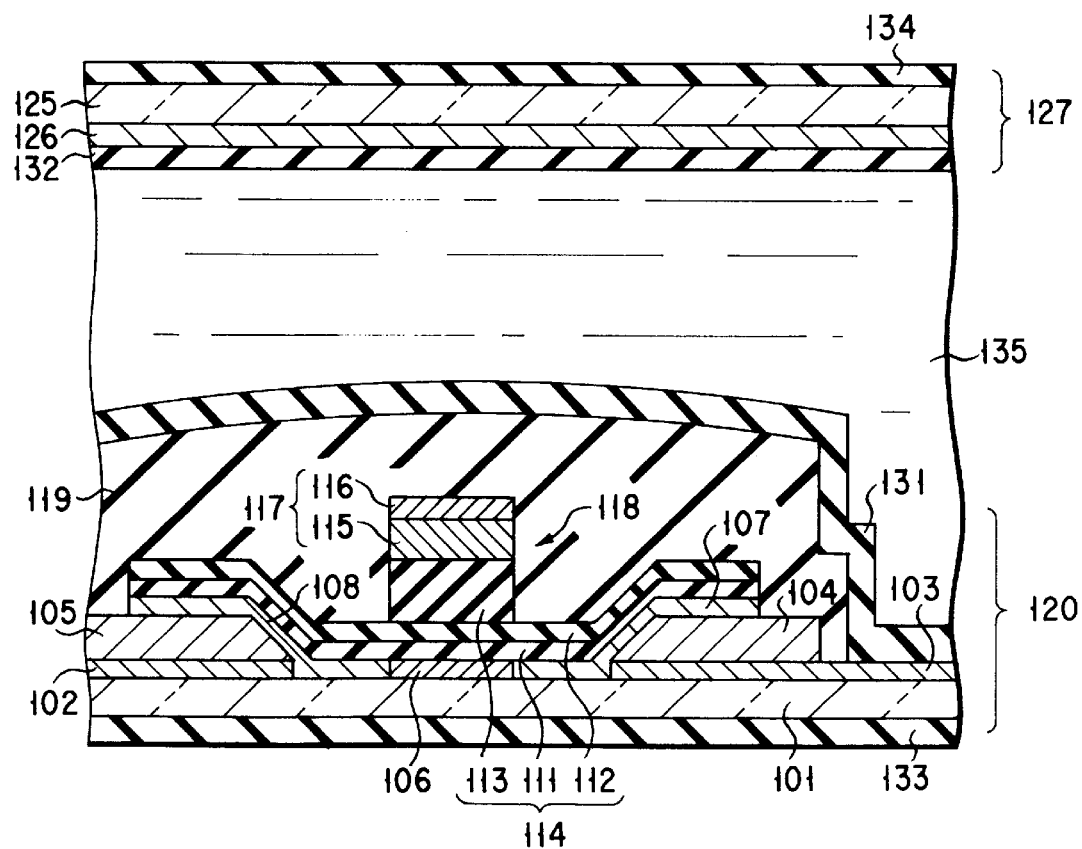
FIG. 11 is a cross sectional view schematically showing the structure of an active matrix type liquid crystal display device according to a second embodiment of this invention.

FIG. 11 schematically shows the structure of the liquid crystal display device. The liquid crystal display device includes an array substrate 120 having a plurality of pixel electrodes 103 arrayed in a matrix form, a counter substrate 127 having a counter electrode 126 formed to face the pixel electrodes 103, a liquid crystal layer 135 held between the array substrate 120 and the counter substrate 127, and polarizers 133 and 134 respectively attached to the surfaces of the array substrate 120 and the counter substrate 127 which lie on the opposite sides with respect to the liquid crystal layer 135. The plurality of pixel electrodes 103 are respectively connected to a plurality of top-gate type thin film transistors 118 which are formed as switching elements on the array substrate 120. Each of the thin film transistors 118 is controlled by an external driving circuit to selectively supply a signal voltage to a corresponding one of the pixel electrodes 103 and has a source electrode 104 connected to the corresponding pixel electrode 103, a drain electrode 105 connected to the external driving circuit via a signal line to receive a signal voltage, and a gate electrode 117 connected to the external driving circuit via a scanning line to receive a driving voltage.

The array substrate 120 has a glass substrate 101 prepared as an insulating substrate and a transparent conductive film 102 of ITO (Indium Tin Oxide) formed on one main surface of the glass substrate 101. The pixel electrode is formed by patterning the transparent conductive film 102. Each of the source electrode 104 and drain electrode 105 of the thin film transistor 118 is formed of part of the transparent conductive film 102 and a metal film of molybdenum (Mo)-tungsten (W) alloy formed on the part of the transparent conductive film 102. The array substrate 120 has a non-single crystal silicon layer 106 of, for example, amorphous silicon formed on the glass substrate 120 between the source electrode 104 and the drain electrode 105, a polycrystalline silicon layer 107 formed in contact with the non-single crystal silicon layer 106 and the source electrode 104 on the glass substrate 101 and serving as a source contact region, a polycrystalline silicon layer 108 formed in contact with the non-single crystal silicon layer 106 and the drain electrode 105 on the glass substrate 101 and serving as a drain contact region, a silicon nitride film 111 formed to entirely cover the non-single crystal silicon layer 106, polycrystalline silicon layer 107, polycrystalline silicon layer 108, a silicon oxide/nitride film 112 formed to entirely cover the silicon nitride film 111, and a silicon nitride film 113 formed on the silicon oxide/nitride film 112 in position corresponding to the non-single crystal silicon layer 106. The silicon nitride film 111 is formed with a thickness of 10 nm, the silicon oxide/nitride film 112 is formed with a thickness of 5 nm, and the silicon nitride film 113 is formed with a thickness of 300 nm. The gate insulator 114 is constructed by the silicon nitride film 111, silicon oxide/nitride film 112 and silicon nitride film 113. The gate electrode 117 is constructed by an aluminum (Al) film 115 formed on the silicon nitride film 113 and a molybdenum (Mo) film 116 formed on the aluminum film 115. In this case, the source electrode 104 and drain electrode 105 are displaced back from the gate electrode 117 to reduce parasitic capacitances between the gate electrode 117 and the source electrode 104 and between the gate electrode 117 and the drain electrode 105 which prevent the high-speed operation of the thin film transistor 118 and electrically connected to the non-single crystal silicon layer 106 via the polycrystalline silicon layers 107 and 108 of low-resistance material to lower the contact resistance.

The array substrate 120 further includes an insulating passivation film 119 of silicon nitride (SiN) formed to entirely cover the above structure and a polyimide film 131 formed to entirely cover the insulating passivation film 119 and used as an orientation film.

The counter substrate 127 has a glass substrate 125 prepared as an insulating substrate, a counter electrode 126 formed of a transparent conductive film such as ITO and formed on one main surface of the glass substrate 125, and a polyimide film 132 entirely covering the counter electrode 126 and used as an orientation film.

The liquid crystal layer 135 is formed of a liquid crystal containing material and is held between the array substrate 120 and the counter substrate 127. The polarizers 133 and 134 are disposed on the outside surfaces of the array substrate 120 and the counter substrate 127.

The manufacturing process of the above liquid crystal display device is explained below.

In the manufacturing step of the array substrate 120, a transparent conductive film of ITO is formed on one main surface of the glass substrate 101, and a metal film of molybdenum-tungsten alloy is formed on the transparent conductive film and selectively etched by photolithography to form a pixel electrode 103, source electrode 104 and drain electrode 105. Next, an amorphous silicon layer with a thickness of 100 nm is formed to cover the source electrode 104 and drain electrode 105, a silicon nitride film 111 with a thickness of 10 nm is formed to cover the amorphous silicon layer, a silicon oxide/nitride film 112 with a thickness of 5 nm is formed to cover the silicon nitride film 111, and a silicon nitride film 113 with a thickness of 300 nm is formed to cover the silicon oxide/nitride film 112. The amorphous silicon layer, silicon nitride film 111, silicon oxide/nitride film 112 and silicon nitride film 113 are successively formed by the plasma CVD method while maintaining the vacuum state. This is effected to make a preferable interface state between the non-single crystal silicon layer 106 which is part of the amorphous silicon layer and the gate insulator 114 and enhance the operation characteristic.

After formation of the silicon nitride film 113, an aluminum film 115 is formed to cover the silicon nitride film 113 and a molybdenum film 116 is formed to cover the aluminum film 115. The aluminum film 115 and molybdenum film 116 are selectively etched by photolithography using a resist pattern to form a gate electrode 117. The etching process is effected to form an offset structure in which the width of the gate electrode 117 is smaller than the distance between the source electrode 104 and drain electrode 105.

After formation of the gate electrode 117, the process of etching the silicon nitride film 113 is effected by using the above resist pattern again. In the etching process, the silicon nitride film 113 is selectively etched by plasma etching using a mixture gas of $CF_4$ and oxygen, for example. The silicon oxide/nitride film 112 contains a large amount of oxygen in comparison with nitrogen so as to be etched in the $CF_4/O_2$ gas mixture dry etching at an etching rate which is approx. 100 times lower than that of the silicon nitride film 113 and is used as an etching stopper. The etching time for the silicon oxide/nitride film 112 becomes longer as the ratio of oxygen to nitrogen becomes larger. Further, light emitted in the etching process is monitored to determine the end of the etching process. The $CF_4/O_2$ gas reacts with the silicon nitride film 113 to emit a red light but does not emit the red light even if it reacts with the silicon oxide/nitride film 112. That is, emission of the red light is terminated when the silicon oxide/nitride film 112 is changed from a state in which it is covered with the silicon nitride film 113 to an exposed state. Therefore, the etching process is terminated when emission of the red light is terminated. At the time of completion of the etching process, the entire portion of the upper surface of the amorphous silicon layer is protected by the silicon nitride film 111 and the silicon oxide/nitride film 112.

After the etching process, the ion doping process of phosphorus hydride is effected with the gate electrode 117 used as a mask. In the ion doping process, phosphorus hydride is accelerated with a sufficiently high acceleration voltage and doped into the amorphous silicon layer via the silicon nitride film 111 and silicon oxide/nitride film 112. The acceleration voltage is determined depending on the thicknesses of the amorphous silicon layer, silicon nitride film 111 and silicon oxide/nitride film 112, and is set to 30 to 60 kV, for example.

After completion of the ion doping process, the laser annealing process for the amorphous silicon layer is effected by using the gate electrode 117 as a mask. In the laser annealing process, for example, an excimer laser beam of XeCl is applied to the amorphous silicon layer via the silicon nitride film 111 and silicon oxide/nitride film 112. As a result, part of the amorphous silicon layer which is not masked by the gate electrode 117 is changed into a polycrystalline form as the polycrystalline silicon layers 107 and 108, and part of the amorphous silicon layer which lies between the polycrystalline silicon layers 107 and 108 is left as the non-single crystal silicon layer 106. In this case, the silicon nitride film 111 and silicon oxide/nitride film 112 are used to reduce the surface reflectivity of the amorphous silicon layer with respect to the excimer laser beam. Further, in order to attain uniform crystal distribution, it is preferable to scan the amorphous silicon layer in an overlapped fashion by use of laser beams which are overlapped by an amount larger than half the beam diameter.

After the laser annealing process, the polycrystalline silicon layers 107 and 108 are selectively etched by photolithography together with the silicon nitride film 111 and silicon oxide/nitride film 112 to leave portions acting as the source and drain contact regions.

After the etching process, for example, an insulating passivation film 119 of silicon nitride is formed to cover the above structure. Further, the insulating passivation film 119 is removed from the upper surfaces of the pixel electrode 103 and the peripheral electrodes together with a metal film of molybdenum-tungsten alloy by photolithography. After this, a polyimide film 131 is formed to cover the insulating passivation film 119 and pixel electrode 103. The array substrate 120 is thus formed.

In the counter substrate 127, a counter electrode 126 of ITO is formed on a glass substrate 125 as shown in FIG. 11 and a polyimide film 132 is formed to cover the counter electrode 126.

If the array substrate 120 and counter substrate 127 are formed as described above, they are placed with the polyimide films 131 and 132 set to face each other and the liquid crystal containing material is sealed into between the array substrate 120 and the counter substrate 127, and polarizers 133 and 134 are respectively attached to the surface of the array substrate 120 which lies on the opposite side with respect to the polyimide film 131 and to the surface of the counter substrate 127 which lies on the opposite side with respect to the polyimide film 132.

According to the second embodiment, the silicon nitride film 111, silicon oxide/nitride film 112 and silicon nitride film 113 are stacked on the amorphous silicon layer and patterned as the gate insulator 114 by the etching process. That is, the gate insulator 114 is constructed by two or more films having different etching rates. In this case, the etching process for the gate insulator 114 is unfailingly stopped at the silicon oxide/nitride film 112 which is etched at a lower etching rate than the silicon nitride film 113 so as to prevent the surface of the amorphous silicon layer from being etched. Further, the silicon nitride film 111 and silicon oxide/nitride film 112 are left as a protection layer on the amorphous silicon layer after the above etching process, so as to prevent the gate electrode 117 from being brought into contact with and electrically short-circuited to the polycrystalline silicon layers 107 and 108 of low resistance formed by the laser-annealing process for the amorphous silicon layer and serving as the source and drain contact regions. Therefore, a liquid crystal display device whose yield is improved and whose productivity is enhanced can be provided.

Further, since the surface reflectivities of the silicon nitride film 111 and silicon oxide/nitride film 112 with respect to the excimer laser beam are lower than that of the amorphous silicon layer, the efficiency of absorption of the excimer laser beam into the amorphous silicon layer can be enhanced and the amorphous silicon layer can be more effectively changed into a polycrystalline form. Therefore, the laser energy density required for forming a polycrystalline silicon layer with a desired electric conductivity can be reduced to half the value in the conventional case.

The insulating substrate is not limited to a substrate which is entirely formed of an insulative material. For example, a desired substrate having a dielectric film formed on the exposed surface thereof can be used as the insulating substrate.

If the thickness of the silicon nitride film 111 is 20 nm or less and the sum of the thickness of the silicon oxide/nitride film 112 and the thickness of the silicon nitride film is 50 nm or less, the acceleration voltage required in the ion doping process can be lowered and the ablation of hydrogen from the amorphous silicon layer in the laser annealing process can be caused more easily and smoothly. Therefore, in the above processes, the throughput can be enhanced and the process margin can be enlarged.

The silicon oxide/nitride film 112 can be replaced by a silicon oxide film, or a laminated structure of a silicon oxide/nitride film and a silicon oxide film.

In the second embodiment, the ion doping process is effected before the laser annealing process, but the laser annealing process can be effected without effecting the ion doping process.

Further, in each of the above embodiments, the thin film transistor is used as a switching element in the liquid crystal display device. However, the thin film transistor can be used as an image sensor in the application other than the liquid crystal display device, for example.

Moreover, each of embodiments uses an amorphous silicon layer as the non-single crystal silicon layer. However, this non-single crystal silicon layer can be formed as a layer containing micro-crystalline silicon containing or polycrystalline silicon.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A thin film transistor comprising:
   an insulating substrate;
   a non-single crystal silicon layer formed on said insulating substrate;
   a gate insulator formed on said non-single crystal silicon layer;
   a gate electrode formed on said gate insulator;
   source and drain contact regions of polycrystalline silicon formed in said non-single crystal silicon layer on both sides of said gate electrode; and
   source and drain electrodes formed respectively in contact with said source and drain contact regions;
   wherein:
   said gate insulator includes a first insulating film and a second insulating film formed on said first insulating film,
   said first insulating film covers at least said source and drain contact regions, and
   said second insulating film has an etching rate different from that of said first insulating film and is located at a position corresponding to said gate electrode between said source and drain contact regions.

2. A thin film transistor according to claim 1, wherein said second insulating film is a silicon nitride film.

3. A thin film transistor according to claim 2, wherein said first insulating film includes a silicon nitride film formed to cover said source and drain contact regions and part of a non-single crystal silicon layer disposed between said source and drain contact regions and a silicon oxide film formed to entirely cover said silicon nitride film.

4. A thin film transistor according to claim 3, wherein the thickness of the silicon nitride film of said first insulating film is not greater than 20 nm and the total sum of the thicknesses of the silicon oxide film and the silicon nitride film of said first insulating film is not greater than 50 nm.

5. A thin film transistor according to claim 2, wherein said first insulating film includes a silicon nitride film formed to cover said source and drain contact regions and part of a non-single crystal silicon layer disposed between said source and drain contact regions and a silicon oxide/nitride film formed to entirely cover said silicon nitride film.

6. A thin film transistor according to claim 5, wherein the thickness of the silicon nitride film of said first insulating film is not greater than 20 nm and the total sum of the thicknesses of the silicon nitride film and the silicon oxide/nitride film of said first insulating film is not greater than 50 nm.

7. A liquid crystal display device comprising:
   an array substrate having thin film transistors formed thereon;
   a counter substrate disposed to face said array substrate; and
   a liquid crystal layer held between said array substrate and said counter substrate;
   wherein:
   each of said thin film transistors has:
      a non-single crystal silicon layer formed on an insulating substrate.
      a gate insulator formed on said non-single crystal silicon layer,
      a gate electrode formed on said gate insulator,
      source and drain contact regions of polycrystalline silicon formed in said non-single crystal silicon layer on both sides of said gate electrode, and
      source and drain electrodes formed respectively in contact with said source and drain contact regions;
   said gate insulator includes a first insulating film and a second insulating film formed on said first insulating film;

said first insulating film covers at least said source and drain contact regions; and said second insulating film has an etching rate different from that of said first insulating film and is located at a position corresponding to said gate electrode between said source and drain contact regions.

* * * * *